(12) United States Patent
Chalil

(10) Patent No.: US 9,002,033 B2
(45) Date of Patent: Apr. 7, 2015

(54) SCALING A PLURALITY OF SIGNALS TO PREVENT AMPLITUDE CLIPPING

(75) Inventor: Mohammed Chalil, Bangalore (IN)

(73) Assignee: Analog Devices, Inc., Norwood, MA (US)

( * ) Notice: Subject to any disclaimer, the term of this patent is extended or adjusted under 35 U.S.C. 154(b) by 373 days.

(21) Appl. No.: 13/480,863

(22) Filed: May 25, 2012

(65) Prior Publication Data

US 2012/0230496 A1 Sep. 13, 2012

Related U.S. Application Data

(63) Continuation of application No. 12/412,974, filed on Mar. 27, 2009, now Pat. No. 8,208,659.

(60) Provisional application No. 61/072,029, filed on Mar. 27, 2008.

(51) Int. Cl.
*H03G 7/00* (2006.01)
*H03G 11/00* (2006.01)

(52) U.S. Cl.
CPC ............. *H03G 7/007* (2013.01); *H03G 11/008* (2013.01)

(58) Field of Classification Search
USPC ............... 381/106, 104, 107, 102, 56, 58, 59; 700/94
See application file for complete search history.

(56) References Cited

U.S. PATENT DOCUMENTS

| | | | |
|---|---|---|---|
| 6,882,735 B2 * | 4/2005 | Staley | 381/106 |
| 7,343,019 B2 * | 3/2008 | Hankins et al. | 381/107 |
| 8,208,659 B2 | 6/2012 | Chalil | |
| 2005/0147262 A1 * | 7/2005 | Breebaart | 381/106 |

OTHER PUBLICATIONS

U.S. Appl. No. 12/412,974, filed Mar. 27, 2009.

* cited by examiner

*Primary Examiner* — Xu Mei
*Assistant Examiner* — David Ton
(74) *Attorney, Agent, or Firm* — Patent Capital Group

(57) ABSTRACT

Systems and methods for amplitude compressing a digital signal. An input signal is divided into frames having a first and second sets of samples. The samples in the second set are also in a subsequent frame. Peak values are determined for the first and second sets. One or more slopes are calculated based on the peak values. The slopes are used to define a scale factor which is applied to the first set to produce the output signal. For example, if the first peak value exceeds an amplitude threshold, first and last samples in the first set to exceed the amplitude threshold are found. Slopes are calculated for each of three regions of the first set demarcated by the first and last samples. In each region a slope is selected. These slopes along with an initial scale factor are used to calculate the scale factor.

20 Claims, 11 Drawing Sheets

SCALING A PLURALITY OF SIGNALS TO PREVENT AMPLITUDE CLIPPING

RELATED APPLICATIONS

This application is a continuation of U.S. patent application Ser. No. 12/412,974, filed on Mar. 27, 2009 now U.S. Pat. No. 8,208,659, which claims priority to U.S. Provisional Application Ser. No. 61/072,029, filed Mar. 27, 2008, the entire disclosures of which are hereby incorporated by reference herein.

BACKGROUND

Clipping is a type of distortion that occurs when a signal exceeds an amplitude threshold. An amplitude threshold may be a limit of the dynamic range of a system. Upper and lower amplitude thresholds may define the bounds of the dynamic range.

A system "clips" a signal by reducing all values that exceed the upper or lower amplitude thresholds. Clipping introduces high frequency harmonics to the signal's frequency spectrum.

The dynamic range is a characteristic of a system to which the signal is being input. For example, an analog signal may be limited to a voltage range provided by a positive voltage source and negative voltage source for a system. As another example, a sample for a digital signal may be limited to a predetermined number of levels, such as when signal samples are quantized to 8 bits.

In the context of an audio signal, pulse code modulation (PCM) clipping occurs when high precision digital samples are being converted to lower precision PCM samples. For example, PCM clipping may occur when a 32-bit sample output from an audio decoder is converted to a 1.6-bit sample. As another example, PCM clipping may occur when 24-bit samples are provided to a 16-bit input of an encoder. Other audio processes like graphic equalization and mixing may lead to PCM clipping.

Practical systems, such as audio encoders/decoders and amplifiers, are limited in dynamic range. A system designer should consider design tradeoffs, such as between memory or voltage source requirements and cost, when selecting a dynamic range for a system. The system designer should contemplate how the system will respond to an input signal that exceeds the dynamic range of the system. Specifically, the system designer should determine how an input signal will be represented inside the system when it exceeds the system's dynamic range.

One solution for dealing with input signals that exceed the dynamic range is to effectively prevent the signal from being input to the system if it exceeds the dynamic range. The system may be protected using a fuse or similar device which disables the system when the dynamic range is exceeded.

Another solution for dealing with signals that exceed the dynamic range of the system is to simply represent portions of the input signal exceeding the dynamic range by the amplitude threshold. This solution produces a "clipped" signal, where the portions of the signal exceeding the upper and lower amplitude thresholds appear cut off. This type of system is said to hard clip the signal.

To avoid clipping, the gain of the input signal may be reduced. For example, if the signal is known, the gain may be set such that the peak value of the signal is made equal to the amplitude threshold. This technique may be used, for example, when preparing an audio track to be written to a compact disc (CD). Because the gain is reduced for the entire signal, no distortion is introduced to the signal.

In many circumstances, the input signal is not fully known before the system begins processing the signal. Because the range of the signal is not known, a fixed gain, other than zero, cannot be chosen to ensure that clipping is prevented. Dynamic range compression (DRC) may be used to dynamically adjust the gain of a signal. Clipping may be viewed as a form of dynamic range compression. Though, the amount of distortion introduced, by clipping is generally undesirable.

In the context of an audio signal, clipping produces "popping" and "distortion" when played back to a listener. When the audio signal is musical, clipping may prevent a note from decaying in a normal amount of time, resulting in notes played in close succession to blend together. Also, all the clipped portions of the music will sound equally loud since they are all being played at the limit of the dynamic range.

SUMMARY

Systems and methods for dynamically compressing the amplitude of a digital signal are provided. The output signal does not exceed a defined amplitude threshold, yet has a low total harmonic distortion when compared to the clipped signal.

Amplitude compressing an input signal is achieved in some embodiments by dividing the input signal is into frames for processing. Each frame has a first set of samples for which a scale factor is calculated. The scale factor may be an array with a length equal to the number of samples in the first set of samples. The scale factor is multiplied by the first set of samples to produce the scaled output samples for the frame. In addition to a first set of samples, the frame has a second set of samples for which the scale factor will be calculated in a subsequent frame.

The first and second set of samples, along with an initial scale factor are used to determine the scale factor for each sample in the first set of samples. To determine the scale factor, peak values among the first and second set of samples are found.

If the peak value in the first set of samples exceeds the amplitude threshold, the first and last samples in the first set of samples to exceed the amplitude threshold are found. These samples divide the first set of samples into three regions. A set of slopes are calculated for each region. The slopes are based on an initial scale factor, which may be fixed or determined in a previous frame, and on the peak values from among the first and second sets of samples. In each region one of the calculated slopes is chosen. For example, the minimum slope may be chosen in each region. The three chosen slopes along with the initial scale factor and the indexes of the first and last samples in the first set of samples to exceed the amplitude threshold may be used to calculate the scale factor.

If the peak value in the first set of samples does not exceed the amplitude threshold, a single slope is selected for the scale factor and applied to all samples in the first set of samples.

The scale factor, now determined, is multiplied by the first set of samples of the input signal to produce a scaled output signal. A suitable scale factor when applied to the input signal produces an output signal that does not exceed the range defined by the amplitude threshold.

The scale factor for the last sample in the first set of samples may be used as the initial scale factor for the subsequent frame. The process may be repeated until the all samples of the input signal have been processed.

In some aspects, the invention relates to a method of amplitude compressing a digital signal. The method comprises acts of dividing the digital signal into a plurality of frames, each frame comprising a first set of samples and a second set of samples, wherein for each frame having a preceding frame among the plurality of frames, the first set of samples comprises the second set of samples from said preceding frame. The method further comprises for each frame, determining a first peak value from among the first set of samples; determining a second peak value from among the second set of samples; computing, for each sample in the first set of samples, a respective scale factor based at least in part on the first peak value and the second peak value; and scaling the respective amplitudes of each of the samples in the first set of samples.

In another aspect, the invention relates to a computer-readable storage medium comprising computer executable instructions that, when executed, perform a method of amplitude compressing a digital signal. The method comprises acts of identifying a frame of the digital signal, the frame comprising a first set of samples indexed according to a reproduction order; determining a first peak value of a peak sample among the first set of samples exceeds a threshold; determining a lowest index of a sample in the first set of samples that exceeds the threshold; determining a highest index of a sample in the first set of samples that exceeds the threshold; and scaling a respective amplitude of a plurality of samples having an index in the reproduction order between the lowest index and the highest index by at most a ratio of the threshold to the first peak value.

In yet another aspect, the invention relates to a system for amplitude compressing a digital signal, the digital signal comprising a plurality of samples. The system comprises a frame identifying module, a working buffer, and a scaling module. The frame identifying module identifies a plurality of frames, each frame comprising a sequence of samples among the plurality of samples, the sequence of samples comprising a first set of samples followed by a second set of samples. The working buffer stores the sequence of samples for a current frame. The scaling module scales the first set of samples by a scale factor, the scale factor being a plurality of values, each value corresponding to a sample among the first set of samples, the scale factor determined at least in part by a first peak value among the first set of samples for the current frame and a second peak value among the second set of samples for the current frame.

BRIEF DESCRIPTION OF DRAWINGS

The invention and embodiments thereof will be better understood when the following detailed description is read in conjunction with the accompanying drawing figures. In the figures, elements are not necessarily drawn to scale. In general, like elements appearing in multiple figures are identified by a like reference designation. In the drawings.

DETAILED DESCRIPTION

Figure 1:
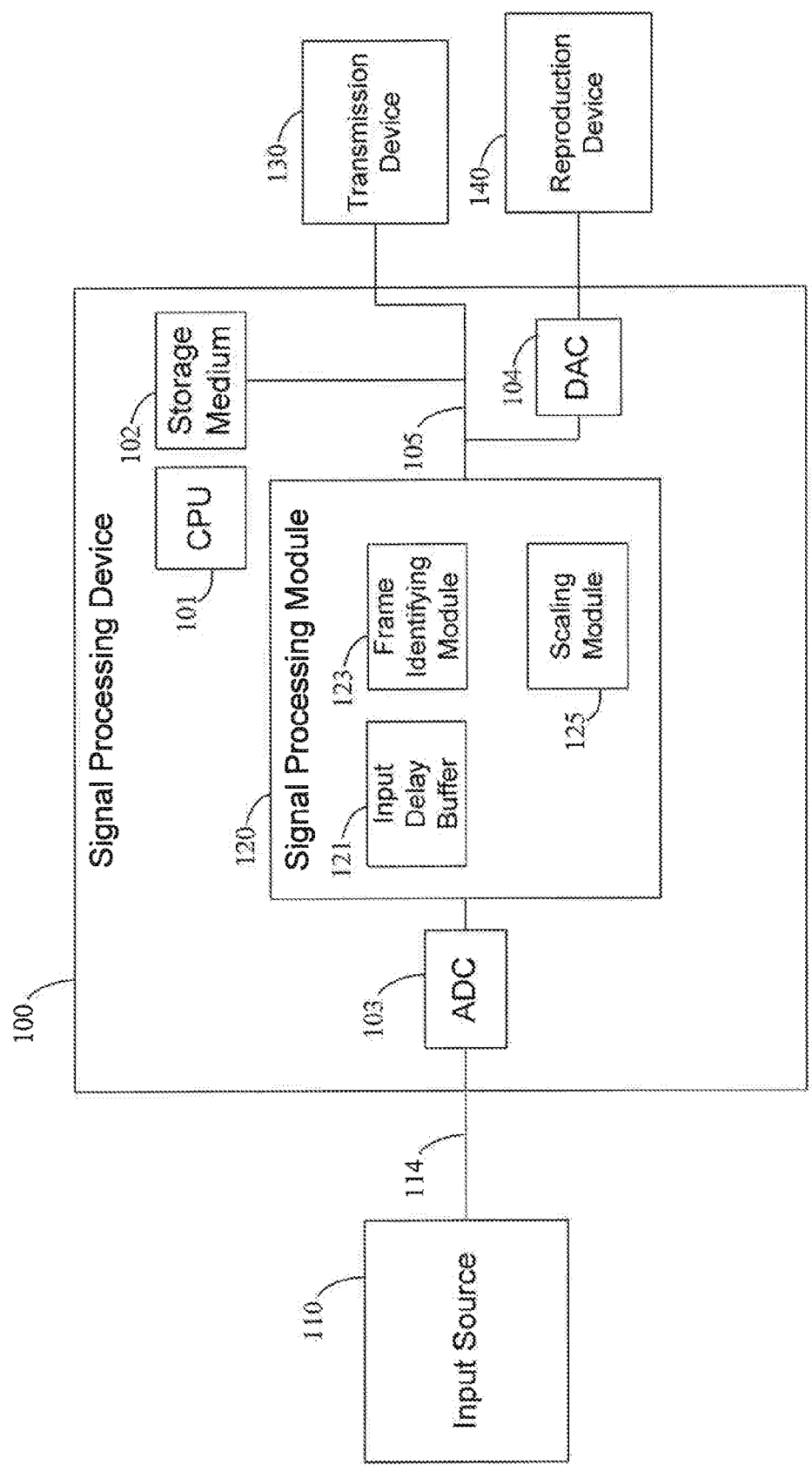
FIG. 1 is a block diagram of a signal processing device for compressing the amplitude of a signal according to some embodiments.

The inventor has recognized and appreciated that dynamically compressing the amplitude of a digital signal while achieving low distortion is desirable. Methods and apparatus that provide low distortion amplitude compression are provided and may be used to prevent signal clipping.

Amplitude compression with low distortion may be achieved by scaling each sample in an input signal by a scale factor. The scale factor is dynamically controlled to prevent clipping while only introducing low distortion to the signal. The scale factor may be determined in discrete "frames" or sets of consecutive samples. Specifically, each frame may have a first portion of N samples and a second portion of M samples. In each frame, a scale factor is determined for the N samples in the first portion of the frame. Specifically, an individual scale factor may be defined for each of the N samples in the first portion. The scale factor may be treated as an array where each entry is a scale factor for a corresponding sample in the first portion of the frame.

The M samples of the second portion are used along with the N samples of the first portion to determine the scale factor for the N samples in the first portion of the frame. The scale factor for the M samples in the second portion of the frame may be determined in a subsequent frame or frames.

Each of the N samples in the first portion of the frame is multiplied by the corresponding scale factor to produce a scaled output. An appropriately determined scale factor ensures that the output signal does not exceed a predetermined amplitude threshold.

The scale factor for the first N samples of a frame may be determined based on a last scale factor of a preceding frame and characteristics of samples in the current frame. First, the maximum amplitude value among the samples in the first portion of the frame and the maximum amplitude value among the samples in the second portion of the frame are found. If either or both of these amplitudes exceeds the amplitude threshold, then it indicates scaling is needed to prevent the output signal from exceeding the amplitude threshold. If the maximum amplitude in the first portion exceeds the amplitude threshold, then the first and last samples in the first portion of the frame to exceed the amplitude threshold are found. Similarly, if the maximum amplitude in the second portion exceeds the amplitude threshold, then the first sample in the second portion to exceed the amplitude threshold is found. These features in combination with the scale factor of the last sample in the first portion of the previous frame may be used to define the scale factor for all of the N samples in the first portion of a current frame.

Each of the frames may be processed, for example, serially, to provide a scaled output signal. If the input signal is a function of time, then, according to some embodiments, it may optionally be processed in near real time. A slight delay may be introduced to fill the frame with samples before processing. A delay of M+N times a sample rate of the input signal or greater may be introduced according to some embodiments. By delaying generation of the output signal, changes to the scale factor to prevent clipping may be implemented gradually over the course of the delay period, reducing distortion. Because the scale factor is changed gradually, the output signal may not have strong high frequency harmonics characteristic of a clipped signal. The scale factor may vary over the course of the signal so that when the signal does not exceed the amplitude threshold over several frames, for example, it may be output at or near the same amplitude as the input signal.

The systems, methods, and apparatus described herein may be applied to any suitable type of signal or set of signals. For example and not limitation, suitable input signals include electrical signals, optical signals, acoustic signals, audio signals, pressure signals, and fluid signals. Though any suitable signal that may be represented digitally may be used.

FIG. 1 illustrates a signal processing device 100 according to some embodiments. Signal processing device 100 receives an input signal 114 from an input source 110, scales input signal 114 to prevent clipping, and outputs a scaled output signal 105.

Input signal 114 may be received from input source 110. Input source 110 may be any suitable device for providing a signal. In some embodiments input source 110 may be a computer storage medium from which the input signal 114 is read. Input source 110 may be a receiver for receiving a broadcast signal. In some embodiments, input source 110 is a sensor, such as a microphone. In yet some other embodiments, input source 110 is a disc player configured to read a CD, a DVD, a Blue-ray disc, or any other analog or digital storage medium. In the context of an audio signal, input source 110 may be an audio decoder, such as a 32-bit audio decoder. How input signal 114 is provided is not critical to the invention.

Though input source 110 is shown providing one input signal 114, it should be understood that multiple input signals may be provided by input source 110 or other input sources.

Signal processing device 100 may be any suitable type of computing device for amplitude compressing input signal 114 to generate output signal 105. For example, device 100 may be an audio encoder/decoder, a computer, a personal digital assistant (PDA), a laptop, a server, a portable audio player, or any other suitable type of computing device. In some embodiments, device 100 may have a processor 101, a memory 102, an analog-to-digital converter (ADC) 103 and/or a digital-to-analog converter (DAC) 104. Though, any suitable configurations may be used.

Processor 101 may be any suitable processing device such as, for example and not limitation, a central processing unit (CPU), a digital signal processor (DSP), a controller, an addressable controller, a general or special purpose microprocessor, a microcontroller, an addressable microprocessor, a programmable processor, a programmable controller, a dedicated processor, a dedicated controller, or any other suitable processing device.

Memory 102 may be integrated into processor 101 and/or may include "off-chip" memory that may be accessible to processor 101, for example, via a memory bus (not shown). Memory 102 may store software modules that when executed by processor 101 perform a desired function. Memory 102 may be any suitable type of computer-readable storage medium such as, for example and not limitation, random-access memory (RAM), a nanotechnology-based memory, one or more floppy discs, compact discs, optical discs, volatile and non-volatile memory devices, magnetic tapes, flash memories, a hard disk drive, circuit configurations in Field Programmable Gate Arrays, or other semiconductor devices, or other tangible computer storage medium.

ADC 103 may be used to digitize an analog input signal 114. In some embodiments, for example, where input signal 114 is a digital signal, ADC 103 may be optional. ADC 103 is any suitable type of analog-to-digital converter configured to sample and quantize input signal 114. In some embodiments, 16, 24, or 32 bit samples may be converted at a rate of 22.05 kHz or 44.1 kHz. Though, any suitable sample rate and quantization may be used.

DAC 104 may be used to convert output signal 105 into an analog signal. For example, if input signal 114 represents audio, DAC 104 may be used to provide a voltage waveform of output signal 105. The voltage waveform may be provided to a reproduction device 140, such as an amplifier and speaker system, for playback. DAC 104 may be optional in some embodiments, such as, for example, in embodiments where an analog output signal is not required.

Signal processing device 100 may include computer executable software modules, each containing computer executable instructions. The software modules may be stored in memory 102 and executed by processor 101, though this is just an illustrative embodiment and other storage locations and execution means are possible. In some embodiments, a signal processing module 120 may be implemented as one or more computer executable modules. However, this and other components may be implemented using any suitable combination of hardware and/or software.

Signal processing module 120 is configured to apply amplitude compression to digitized input signal 114. Signal processing module 120 has an input delay buffer 121 to buffer input signal 114. A frame identifying module 123 identifies frames, or sets of samples of input signal 114 for processing by a scaling module 125. Scaling module 125 applies a suitable method for amplitude scaling samples in each frame identified by frame identifying module 123. Scaling module 125 may, for example implement methods 200 and/or 300, which are subsequently described. Scaling module 125 produces output signal 105 which is an amplitude scaled and delayed version of the input signal 114.

If multiple input signals 114 are received, they may be processed by signal processing device 100 simultaneously. In some embodiments, signal processing device 100 has multiple instances of signal processing module 120. Though, signal processing module 120 itself may be configured to process multiple input signals 114. In some embodiments, signal processing module 120 applies the same scale factor to multiple signals. For example, if input signals 114 represent the right and left channel of a stereo audio signal, both channels may be scaled identically to maintain the original balance.

How output signal 105 is used after generation is not critical to the invention. The output signal may be used in any suitable way. In some embodiments, output signal 105 is written to a suitable storage medium, such as memory 102. For example, output signal 105 may be written to a storage medium input signal 114 was read from. In some embodiments, output signal 105 is saved to a file in a suitable format. For example, output signal 105 may be an audio signal and saved as a WAV or MP3 file. Though, any suitable file format may be used.

In some embodiments, output signal 105 is transmitted using a suitable transmission device such as transmission device 130. Transmission device 130 may be a wired or wireless network interface, a broadcasting system, or any suitable device for transmitting output signal 105 to a receiving device.

Though input source 110, transmission device 130 and reproduction device 140 are shown as separate from signal processing device 100, it should be appreciated that these components may be part of signal processing device 100.

Figure 2:
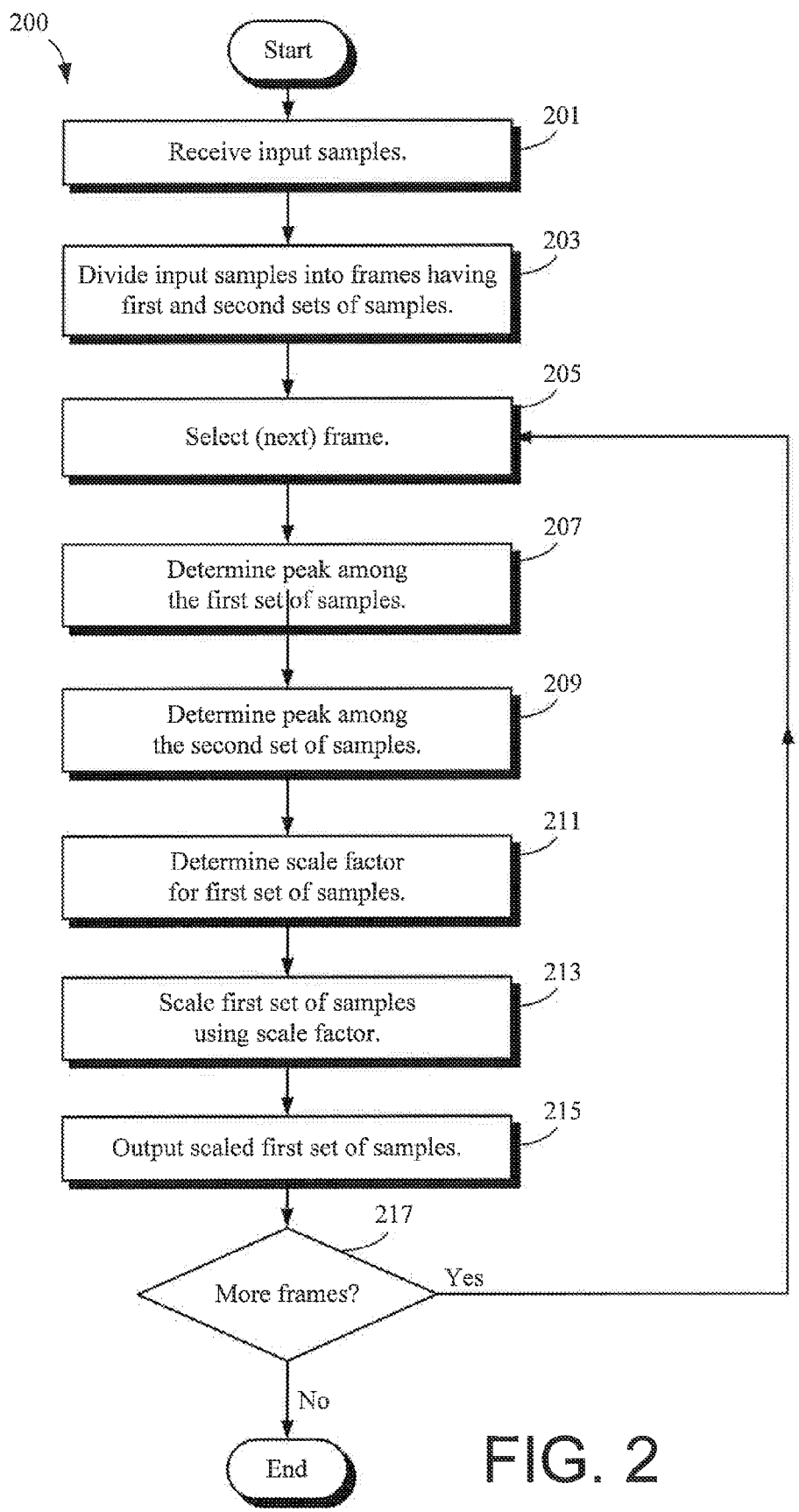
FIG. 2 is a method for compressing the amplitude of a signal according to some embodiments.

Having described signal processing device 100 with reference to FIG. 1, a description is provided for a method 200, shown in FIG. 2. Method 200 is a method for amplitude compressing a digital signal. According to some embodiments, signal processing device 100 may be configured to perform method 200. Though, method 200 may be implemented in any suitable way.

At step 201, input samples representing an input signal are received. The samples may be received from any suitable device in any suitable way. For example, the samples may be read from a computer storage medium, received over a wired or wireless network interface, an antenna, or any other suitable source. In some embodiments, the input samples may be "streamed" to a device for implementing method 200. Step 201 may proceed simultaneous to the remaining steps of method 200. In this way, only a small delay for determining a scale factor may be introduced between the input signal and an output signal. Though, any suitable delay may be used between receiving input samples at step 201 and processing according to steps 203-217.

In some embodiments, step 201 may optionally involve digitizing the input signal. For example, when the input signal is an analog signal. Digitization may be performed using any suitable analog-to-digital converter, such as ADC 103 (FIG. 1).

The input samples may have a sample order associated with them. That is, an order in which the samples may be reproduced to generate the signal they represent. In some embodiments, the samples may be indexed according to the sample order. In some embodiments, the indexing is implied by the order in which the samples are received, or how the samples are written to a computer storage medium.

At step 203, the input samples are divided into frames. Each frame may have a predetermined number of samples, for example, 1,024 samples. Though a frame may have any suitable number of samples.

Consecutive frames may have overlapping sets of samples. That is, some of the samples in a frame may also be in a preceding and/or a subsequent frame. For example the first M samples of a frame may be the last M samples of the preceding frame. The amount of overlap is defined as the delay buffer size. In some embodiments, the delay buffer size is an integer power of two. Herein the number of samples in the delay buffer is represented by an integer, M. The delay buffer size may be the same in all frames. Though, the delay buffer size may be chosen to in any suitable way and may vary from one frame to the next.

The remaining samples of the frame are formed by samples in an input buffer. Herein the number of samples in the input buffer is represented by an integer, N. The input buffer size may be the same in all frames. Though, the input buffer may be chosen to in any suitable way and may vary from one frame to the next. In some embodiments the input buffer size is an integer power of two. Though the input buffer may be any suitable size. The input buffer and delay buffer may be chosen such that N>M. Thought this is not critical and any suitable values of N and M may be chosen.

The total number of samples in a frame used for analysis is M+N. The M+N samples of the frame may be stored in a working buffer, such as an indexed array, for processing. Though, the samples of the current frame may be stored in any suitable way.

At step 205, a frame is selected for processing. In some embodiments, the frame selected for processing is selected chronologically based on the sample order. Steps 207 through 215 are performed for each frame to suitably compress the amplitude of the first N samples of the frame. Compressing the sample amplitudes ensures that the magnitude of the output signal is less than an amplitude threshold, C. The amplitude threshold may be determined in any suitable way. For example, the amplitude threshold may correspond to a voltage limit of a reproduction system, such as the voltage rails of an amplifier. As another example, the amplitude threshold may be determined by a number of available bits to represent the output signal. For example, the amplitude threshold may be the highest value that may be represented by the number of available bits.

At step 207, a first peak, $X_1$, is determined for a first set of samples. The first set of samples may be the first N samples of the working buffer for the frame. The value of the first peak may be determined by the largest absolute magnitude of a sample from among the first set of samples.

At step 209, a second peak, $X_2$, is determined for a second set of samples. The second set of samples may be the last M samples of the working buffer for the frame. The value of the second peak may be determined by the largest absolute magnitude of a sample from among the second set of samples.

At step 211, a scale factor is determined for each sample in the first set of samples. The set of N scale factors may be stored as a scale factor array. The scale factors are determined and applied to the input signal to ensure that the output signal does not exceed the amplitude threshold. The scale factor for each sample may be chosen based in part on an initial scale factor, $f_o$. The initial scale factor, $f_o$, may be selected as the scale factor of the Nth sample of a frame chronologically immediately preceding the current frame. For the first frame to be processed for the input signal, the initial scale factor may be chosen in any suitable way. In some embodiments, each scale factor is a number between zero and one, inclusive. The term "scale factor" may be used to refer to a scaling value for an individual sample or to the sequence of scaling values for scaling the input signal.

The scale factors are determined in part based on the first peak, $X_1$, and the second peak, $X_2$. The scale factor may be unique for each sample in the first set of samples. The scale factors may be determined for the first set of samples based on whether the first peak and/or second peak exceeds the amplitude threshold, C. According to some embodiments, the scale factors are determined in a first way when both $X_1$ and $X_2$ are less than C; in a second way when $X_1$ is less than C but $X_2$ is greater than C; and in a third way when $X_1$ is greater than C.

In the first case, both $X_1$ and $X_2$ are less than the amplitude threshold, C. If the initial scale factor, $f_o$, for the frame is unity, then the scale factor for all samples in the first set of samples may be chosen as unity. If however, $f_o$ is less than 1, the scale factors increase gradually from $f_o$ towards unity over the first set of samples. Though, the scale factor may not reach unity by Nth sample. In some embodiments, a time constant may govern how quickly the scale factor returns to unity. The time constant may be chosen in any suitable way.

In the second case, $X_1$ is less than the amplitude threshold, C, but $X_2$ is greater than C. This indicates that the input signal does not exceed the amplitude threshold in the first set of samples but does exceed the amplitude threshold in the second set of samples. In order to prepare for the scaling required in a subsequent frame, the scale factor is gradually adjusted over the course of the first set of samples in the current frame. By adjusting the scale factor for the first set of samples in the current frame, a rapid change in scale factor may be avoided in the subsequent frame. In some embodiments, the scale factor is linearly increased or decreased from the initial scale factor, $f_o$, so that the scale factor will reach an appropriate value in the subsequent frame.

In the third case, $X_1$ is greater than the amplitude threshold, C. Accordingly, the first set of samples may be divided into three regions. The first region contains all the samples up to and including the first sample from among the first set of samples having a magnitude in excess of the amplitude threshold, C. The second region contains all the samples after that first sample up to and including the last sample from among the first set of samples having a magnitude in excess of the C. The third region contains all the samples after the last sample having a magnitude greater than C. Note that all samples in the first and third region have magnitudes less than C and that the sample having the peak value, $X_1$, is in the second region.

In each region the slope of the scale factor is determined. Using these three slopes and the initial scale factor, $f_o$, the scale factor of all the samples in the first set of samples may be found. Each slope is the slope from a starting scale factor to a final scale factor over a number of samples. The starting scale factor is the last scale factor of the preceding region. In the case of the first region, the starting scale factor is $f_o$. The final scale factor may be, for example, $C/X_1$ or $C/X_2$. The number of samples is the distance from the sample to which the starting scale factor is applied to the first sample in the first set of samples having a magnitude in excess of C (in the first region only), the last sample in the first set of samples having a magnitude in excess of C (in the second region only), the first sample in the second set of samples having a magnitude in excess of C (when $X_2 \geq C$), or a predetermined constant such as 2N. Though, other parameters may be used to define a slope. Because multiple slopes may be calculated for each region, suitable logic may be used to select which slope to calculate the scale factor using. For example, in the first region and the second region a minimum slope may be selected.

At step 213, the first set of samples are scaled using the scale factors determined in step 211. The amplitude of each sample may be multiplied by the corresponding scale factor to produce the output signal. In the special case where $f_o$ is unity and both $X_1$ and $X_2$ are less than the amplitude threshold, C, the input samples may be written to the output signal without scaling.

At step 215, the scaled first set of samples are output. For example, the scaled first set of samples forming the output signal may be output in any of the ways described above in connection with signal processing device 100 shown in FIG. 1. Though, samples may be output in any suitable way.

At step 217, a determination is made whether there are more frames to process. If "No", method 200 ends. If "Yes" method 200 returns to step 205 where the next sequential frame is selected for processing according to steps 207 to 215.

Though method 200 has been described for a single input signal, it should be appreciated that method 200 may be applied to multiple input signals to which a common scale factor is to be applied. For example, two synchronous signals may be processed simultaneously according to method 200. At step 215, for each pair of synchronous samples, a minimum of the two corresponding scale factors may be applied to both samples. In this way both signals are scaled by the same scale factor.

Figure 3A:
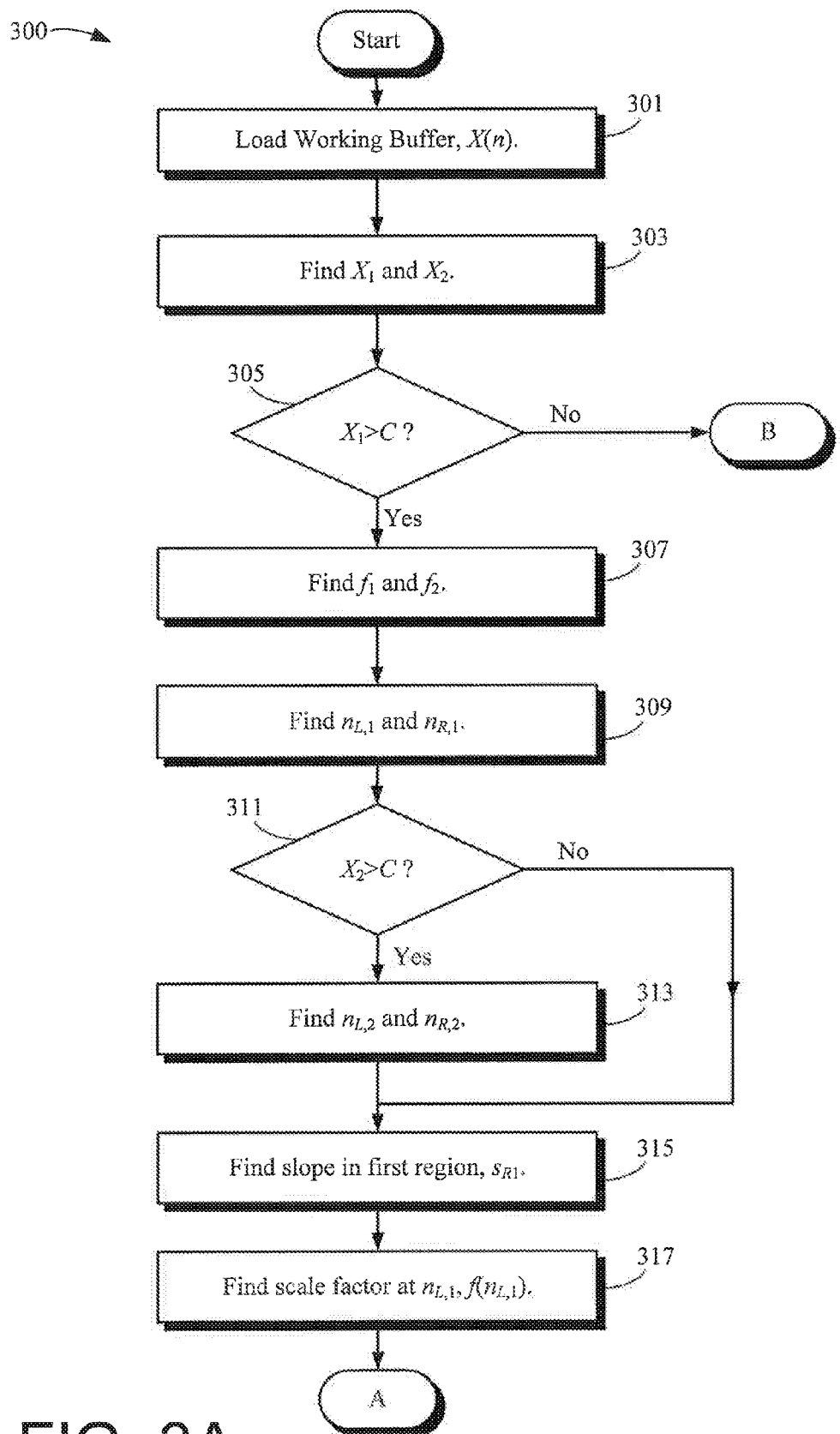
FIGS. 3A-3C is a method for compressing the amplitude of a signal according to some embodiments.
Figure 3B:
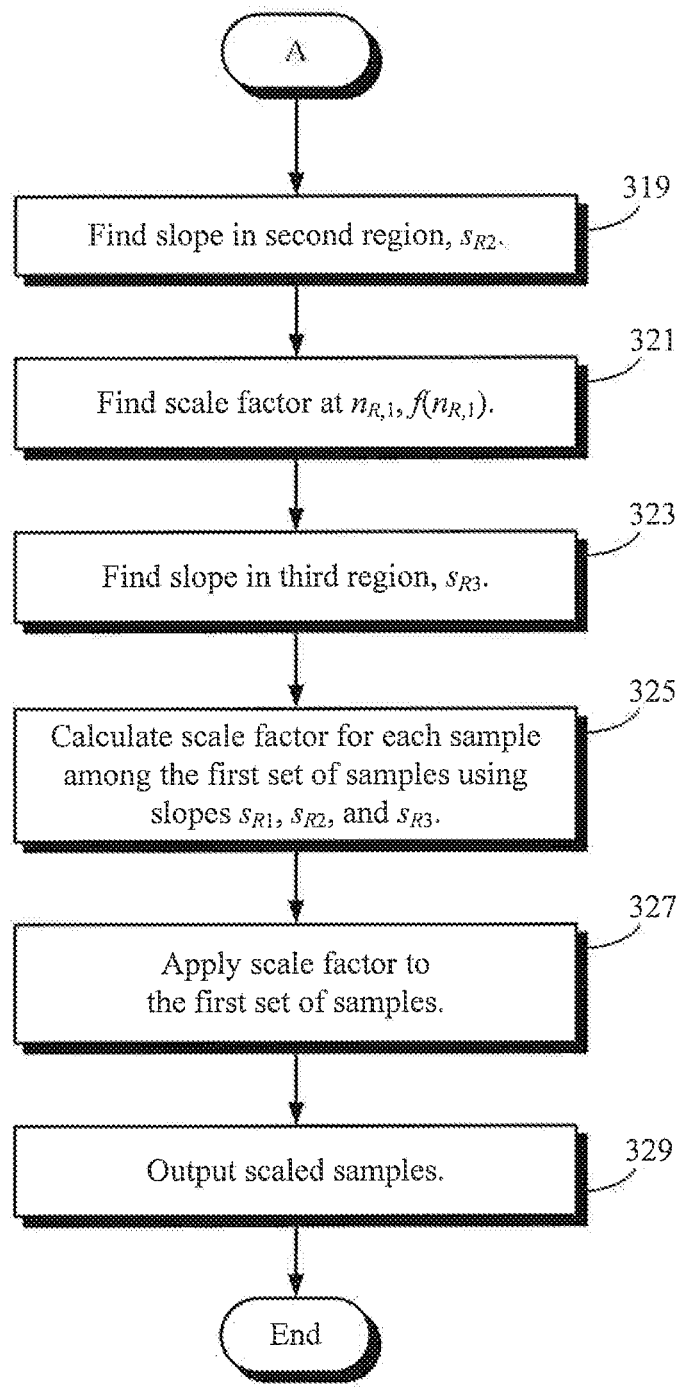
Figure 3C:
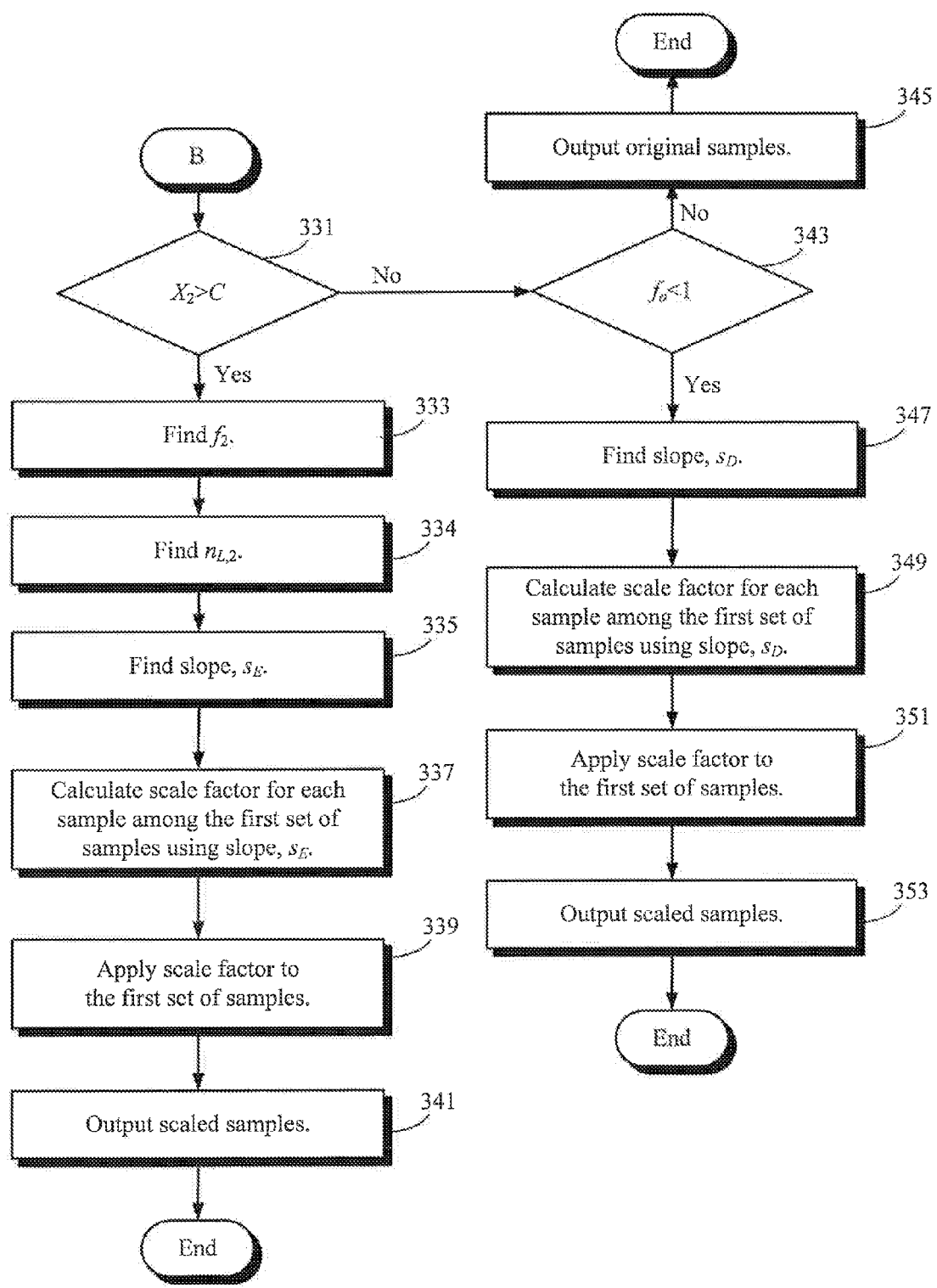

Attention is now turned to method 300, shown in FIGS. 3A-3C. Method 300 is a method for amplitude compressing an input signal to generate a scaled output signal. The output signal is delayed by a number of samples to enable an appropriate amplitude scale factor, f(n), to be determined and applied to the input signal. The output signal has a low total harmonic distortion plus noise (THD+N) when compared to a clipped signal.

Method 300 is described with reference to FIGS. 3A-3C which provide a flow diagram for the method. Additionally, reference is made to FIGS. 4-7 which illustrate various aspects of method 300 according to some embodiments. Table 1 summarizes some of the variables frequently referred to in the description of method 300.

According to some embodiments of method 300, the input signal may be processed discretely in sample frames. Each frame may have N+M samples from the input signal. The frames may be processed sequentially, until, for example, all samples in the input signal have been processed. Each frame is formed from the last M samples from a preceding frame and N new samples from the input stream. Thus M represents the size of the delay buffer while N represents the number of samples that are processed in each frame. Because the first frame is not preceded, the first frame is filled with M+N samples directly from the input signal. The last frame may be suitably buffered with extra samples to ensure method 300 may be applied to all received samples.

TABLE 1

Selected variables as use in method 300.

| Variable Name | Description |
| --- | --- |
| N | integer number of input samples |
| M | integer number of delay samples |
| C | amplitude at which clipping beings |
| f(n) | scale factor as a function of sample index, n |
| $f_o$ | initial scale factor |
| X(n) | input working buffer sample amplitudes; $1 \leq n \leq M + N$ |
| $X_1$ | maximum absolute value of first N samples in working buffer |
| $X_2$ | maximum absolute value of last M samples in working buffer |
| O(n) | output sample amplitudes; $1 \leq n \leq N$ |
| $n_{L,1}$ | first sample index in X(n) for which $|X(n)| \geq C$ when X(n) is searched from n = 1 to n = N |
| $n_{L,2}$ | first sample index in X(n) for which $|X(n)| \geq C$ when X(n) is searched from n = N + 1 to n = M + N |
| $n_{R,1}$ | first sample index in X(n) for which $|X(n)| \geq C$ when X(n) is searched from n = N to n = 1 |

At step 301, a working buffer, X(n), is filled for the frame. The working buffer has M+N samples. In some embodiments N is chosen to be an integer power of 2, that is, $2^i$, where i is an integer. For example, N may be chosen as 128, 256, 512, 1024, 2048, 4096, 8192, or any other positive integer. Similarly, M may be chosen as an integer power of 2. Though, M may be any suitable integer. In some embodiments, M is chosen to be less than or equal to N.

Figure 4:
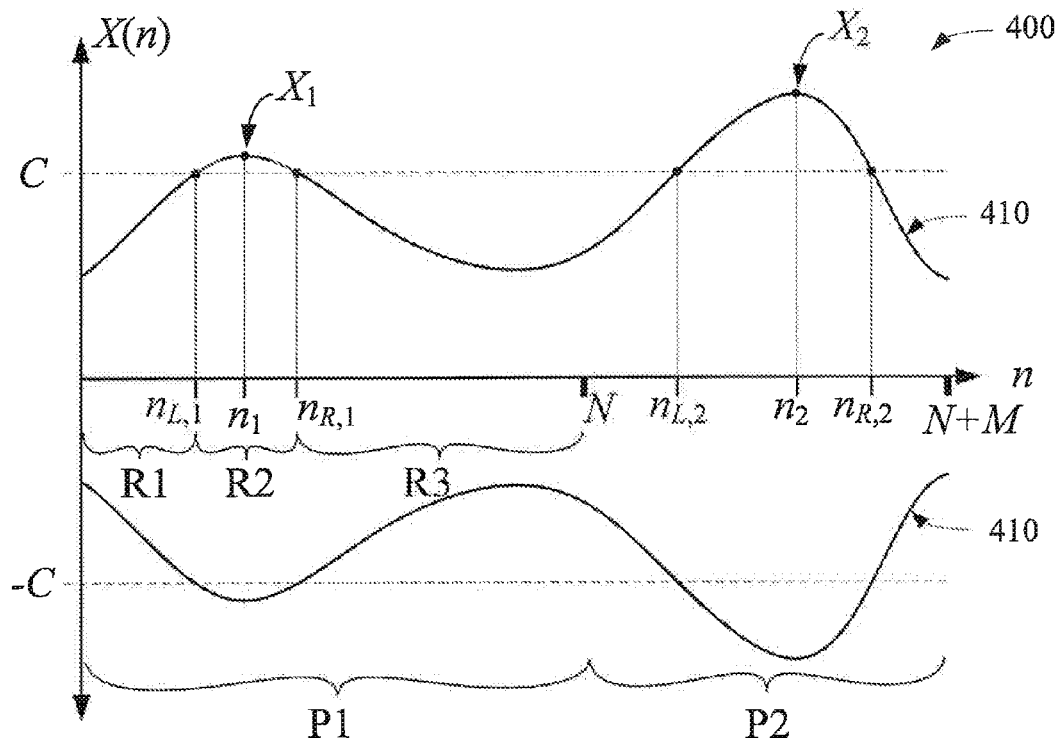
FIG. 4 is a plot of an example envelope of a frame of a signal.

FIG. 4 is a plot 400 of an example working buffer, X(n). For clarity only the envelope 410 of the working buffer is shown. Though, the envelope 410 could also be interpreted as the sample values themselves. In the embodiment described presently, the method is applied directly to the samples, not the envelope. Though in some embodiments, some aspects, such as the peak values and threshold crossings may be determined using the envelope of the working buffer.

As shown in plot 400, the first N samples of the working buffer form a first portion, P1, of the frame and the last M samples of the working buffer form a second portion, P2, of the frame. The remaining features of plot 400 will be explained in the subsequent steps of method 300.

At step 302, processing of the working buffer, X(n), begins by identifying a peak value, $X_1$, in the first portion, P1, and a peak value, $X_2$, the second portion, P2, of the frame. A maximum absolute value is found for the first N samples of the frame.

$$X_1 = \max(|X(n)|), \text{among } 1 \leq n \leq N \quad (1)$$

Let $n_1$ be defined such that $X_1 = X(n_1)$. Similarly, a maximum absolute value is found for the last M samples of the frame.

$$X_2 = \max(|X(n)|), \text{among } N+1 \leq n \leq N+M \quad (2)$$

Let $n_2$ be defined such that $X_2 = X(n_2)$.

At step 305, a determination is made whether the peak value in the first portion is greater than the amplitude threshold, C.

$$X_1 > C? \quad (3)$$

If $X_1$ is greater than C, it indicates that clipping would occur if the signal was simply "played back" without applying a non-trivial scale factor (the trivial scale factor being "1"). To determine the scale factor, method 300 continues to step 307 described presently. If $X_1$ is less than C, method 300 continues to step 331 (FIG. 3C), which is described after steps 307-329.

At step 307, a ratio may be found to determine the maximum value of the amplitude scale factor at $n_1$ such that the amplitude threshold, C, is not exceeded. Namely, $$f_1 = \frac{C}{X_1}. \quad (4)$$

Similarly, a second ratio is defined for the second portion of the frame. Namely, $$f_2 = \frac{C}{X_2}. \quad (5)$$

In some embodiments, it is verified that $X_1$ and $X_2$ are non-zero before calculating $f_1$ and At step 309, the first index and last index, $n_{L,1}$ and $n_{R,1}$, respectively, to meet or exceed C in the first portion of the frame are found. The index $n_{L,1}$ may be found by searching forward from the beginning of the first portion until $|X(n)| \geq C$. For example, index $n_{L,1}$, may be found using the following pseudo code.

```
for n = 1 to N {
    if |X(n)| ≥ C {
        n_{L,1} = n ;
        break;
    }
}
```

The index $n_{R,1}$ may be found by searching backwards from the end of the first portion until $|X(n)| \geq C$. The pseudo code above may be ranged for n from N to 1 until $|X(n)| \geq C$ to find $n_{R,1}$. Though, $n_{L,1}$ and $n_{R,1}$ be found any suitable way. The locations of $n_{L,1}$ and $n_{R,1}$ illustrated on the envelope 410 in plot 400 (FIG. 4).

The indexes and $n_{L,1}$ and $n_{R,1}$ may be used to define three regions in the first portion of the frame. The first, second and third regions, R1, R2, and R3, respectively, may be defined by the index ranges as follows.

$$R1: 1 \leq n \leq n_{L,1}, \quad (6)$$

$$R2: n_{L,1}+1 \leq n \leq n_{R,1}, \text{ and} \quad (7)$$

$$R3: n_{R,1}+1 \leq n \leq N. \quad (8)$$

The three regions are labeled in plot 400 (FIG. 4). In some embodiments, a slope for the scale factor is found in each of these three regions.

At step 311, it is determined if the amplitude of $X_2$ exceeds C in the second portion, P2, of the frame (last M samples).

$$X_2 > C? \quad (9)$$

If so, the method continues to step 313. Otherwise step 313 is skipped and the method continues to step 315.

At step 313, the first and last indexes, $n_{L,2}$ and $n_{R,2}$, respectively, to meet or exceed C in the second portion of the frame may be found. The index $n_{L,2}$ may be found by searching forward from the beginning of the second portion until $|X(n)| \geq C$. Similarly, the index $n_{R,2}$ may be found by searching backwards from the end of the second portion until $|X(n)| \geq C$. In some embodiments, $n_{L,2}$ and $n_{R,2}$ may be found using code similar to the pseudo code above for finding $n_{L,1}$ in step 309. Though, $n_{L,2}$ and $n_{R,2}$ may be found in any suitable way.

At step 315, $s_{R1}$, the slope, of f(n) in the first region is determined. In some embodiments, multiple potential slopes are determined and a minimum slope is selected. For example, in some embodiments a first slope, $s_1$, is calculated between the scale factor $f_1$ and the scale factor at the beginning of the frame, $f_o$, over the distance $n_{L,1}$.

$$s_1 = \frac{f_1 - f_o}{n_{L,1}} \quad (10)$$

Formally, the initial scale factor, $f_o$, may be viewed as the scale factor at n=0 when the first sample indexed has index n=1. The initial scale factor may be chosen, for example, as the last value of the scale factor for the preceding frame. If the current frame is the first frame, $f_o$ may be chosen in any suitable way. For example, $f_o$ may be chosen as 1, $f_1$, or as any other suitable value.

A second slope, $s_2$, is calculated between the scale factor, $f_2$, and the initial scale factor, $f_o$, over the distance $n_{L,2}$ when $X_2 > C$. If $X_2$ is not greater than C, the slope is calculated over the distance 2N or another suitable distance.

$$s_2 = \frac{f_2 - f_o}{n_{L,2}} \text{ if } X_2 > C \quad (11)$$

$$s_2 = \frac{f_2 - f_o}{2N}, \text{ otherwise}$$

In the case where $X_2$ does not exceed C, the distance, 2N is chosen based on experimental observations. Specifically, it reflects a decay time that is suitable for certain values of N when the input signal is an audio signal. It should be appreciated that other, larger or smaller distances may be suitable in some embodiments. The distance may be chosen in any suitable way.

The slope, $s_{R1}$, of the factor, f(n), in the first region may be chosen as the smaller of $s_1$ and $s_n$.

$$s_{R1} = \min(s_1, s_2) \quad (12)$$

Slopes $S_1$ and $s_2$ defined above are some slopes that may be used according to some embodiments. Those of skill in the art will appreciate that additional or alternative slopes may be defined and considered for selection as $s_{R1}$.

Figure 5:
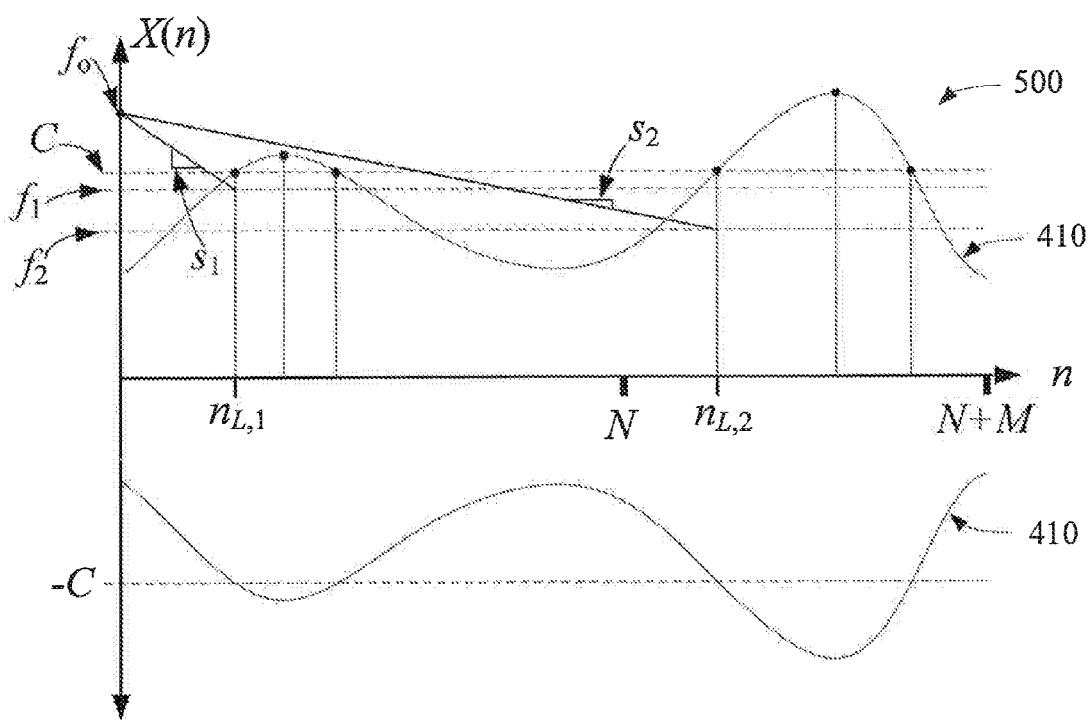
FIG. 5 is a plot of an example envelope of a frame of a signal with potential solutions for the slope of the scale factor in a first region.

Plot 500, shown in FIG. 5, illustrates slope $s_1$ and slope $s_2$ when $X_2 > C$.

It should be appreciated while the envelope 410, the amplitude threshold, C, and the scale factors, $f_o$, $f_1$ and $f_2$ are all plotted on the same axes in plot 500, scale factor is a unitless quantity, while in some embodiments, the envelope 410 and amplitude threshold, C, may have an associated unit. For example, the envelope and threshold may have a unit of "quantization level" which can be directly translated to a voltage by a digital to analog converter.

At step 317, $f(n_{L,1})$, the scale factor to be applied to sample $n_{L,1}$ found. This scale factor may be used to determine the slope in the second region, R2, much like $f_o$ was used to find $s_{R1}$ in the first region.

$$f(n_{L,1}) = f_o + s_{R1} n_{L,1} \quad (13)$$

At step 319 (FIG. 3B), the slope, $s_{R2}$, of the scale factor in the second region, R2, is found. In some embodiments, a set of slopes are calculated and a minimum slope is selected as $s_{R2}$. For example, $s_{R2}$ may be selected as the minimum of two slopes. The first slope, $s_3$, may be defined as $$s_3 = \frac{f_1 - f(n_{L,1})}{n_{R,1} - n_{L,1}} \text{ if } n_{L,1} \neq n_{R,1} \quad (14)$$

$$s_3 = 0, \text{ otherwise.}$$

The second slope, $s_4$, may be defined as $$s_4 = \frac{f_2 - f(n_{L,1})}{n_{L,2} - n_{L,1}} \text{ if } X_2 > C \quad (15)$$

$$s_4 = 0, \text{ otherwise.}$$

The slope, $s_{R2}$, of the scale factor, f(n), in the second region may be chosen as the smaller of $s_3$ and $s_4$.

$$s_{R2} = \min(s_3, s_4) \quad (16)$$

Figure 6:
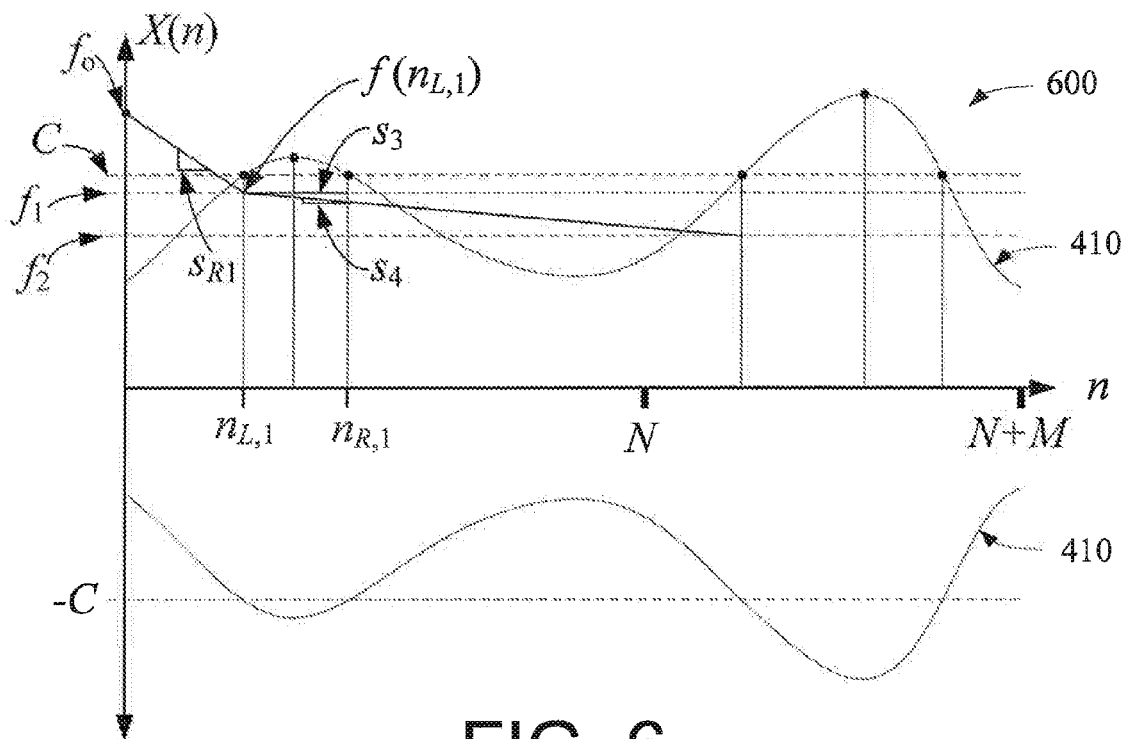
FIG. 6 is a plot of an example envelope of a frame of a signal with potential solutions for the slope of the scale factor in a second region.

Plot 600, shown in FIG. 6, illustrates slopes $s_3$ and $s_4$. If $n_{L,1} = n_{R,1}$, then only one point in the first portion of the frame exceeds the amplitude threshold, C. Namely, the sample $n_1$, where the first peak $X_1$ was found in step 303. The second region, R2 effectively drops out under this condition.

At step 321, the scale factor at $n_{R,1}$, $f(n_{R,1})$ is found. This scale factor may be used to determine the slope in the third region. R3, much like $f_o$ and $f(n_{L,1})$ were used to find $s_{R1}$ and $s_{R2}$ in the first and second regions, respectively, $$f(n_{R,1}) = f(n_{L,1}) + s_{R2}(n_{R,1} - n_{L,1}) \quad (17)$$

At step 323, the slope, $s_{R3}$, of the scale factor, f(n), in the third region, R3, is found. In some embodiments, a set of slopes are calculated. Using suitable selection logic, one of the slopes is selected as $s_{R3}$. In some embodiments, a first slope, $s_5$, is defined as $$s_5 = \frac{f_2 - f(n_{R,1})}{2N}. \quad (18)$$

A second slope, $s_6$, may be defined as $$s_6 = \frac{f_2 - f(n_{R,1})}{n_{L,2} - n_{R,1}} \text{ if } X_2 > C \quad (19)$$

$$s_6 = \frac{1 - f(n_{R,1})}{2N}, \text{ otherwise.}$$

According to some embodiments, the slope, $s_{R3}$, of the factor, f(n) the third region is $$s_{R3} = \min(s_5, s_6), \text{ if } X_2 < C, \text{ else,}$$

$$s_{R3} = s_5, \text{ if } f_2 > f(n_{R,2})$$

$$s_{R3} = s_6, \text{ otherwise.} \quad (20)$$

Figure 7:
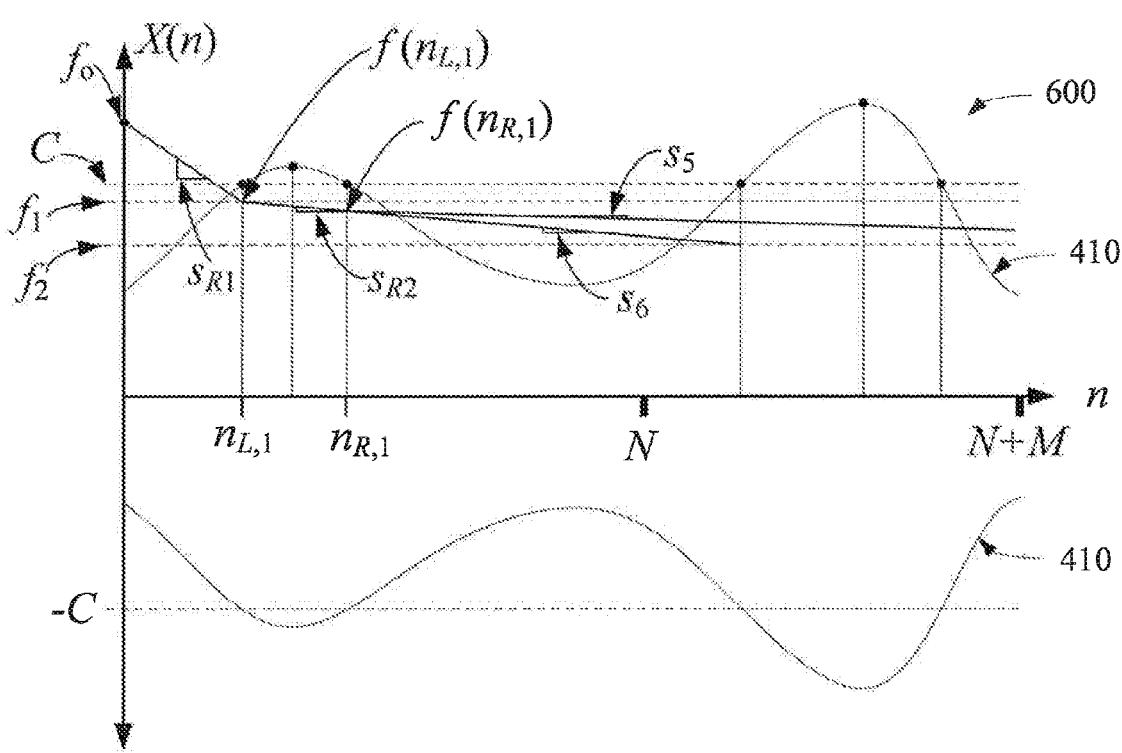
FIG. 7 is a plot of an example envelope of a frame of a signal and a scale factor to be applied according to some embodiments.

For the example of envelope 410, shown in FIG. 7, both $s_5$ and $s_6$ are shown. Using the conditions specified in Eq. 20, for this example, $s_{R3} = s_6$.

At step 325, the scale factor, f(n) is found for each sample in the first portion of the frame. Specifically, $$f(n) = f_o + s_{R1} n, \text{ for } 1 \leq n \leq n_{L,1} \quad (21)$$

$$f(n) = f(n_{L,1}) + s_{R2}(n - n_{L,1}), \text{ for } n_{L,1} + 1 \leq n \leq n_{R,1} \quad (22)$$

$$f(n) = f(n_{R,1}) + s_{R3}(n - n_{R,1}), \text{ for } n_{R,1} + 1 \leq n \leq N. \quad (23)$$

At step 327, the scale factor is applied to the samples in the first portion of the frame. In some embodiments, the scale factor and the first portion of the working buffer are stored as arrays and multiplied term by term. In some other embodiments, a "for" or "while" loop may be used. For example, the code may be similar to the pseudo code below.

```
for n = 1 to N {
    O(n) = f(n)X(n);
}
```

Of course, steps 325 and 327 may be performed simultaneously by substituting the expressions for f(n). Note that f(N) may be defined as $f_o$ for the next frame.

At step 329, the scaled samples are output. For example, the scaled first set of samples forming the output signal, O(n), may be output in any of the ways described above in connection with the signal processing device 100 shown in FIG. 1. Though the output signal may be output in any suitable way.

Having considered the case where $X_1 > C$, the case where $X_1 \leq C$ is described according to some embodiments. If $X_1 \leq C$ the output of step 305 (FIG. 3A) is "No". In this case the method continues to step 331 (FIG. 3C) where it is determined if the amplitude $X_2$ exceeds C. Recall that $X_2$ represents the maximum amplitude in the second portion, P2, of the frame (last M samples of the working buffer).

$$X_2 > C? \quad (24)$$

If $X_2$ is greater than C, method 300 continues to step 333 described presently. If $X_2$ is less than or equal to C, method 300 continues to step 343 (FIG. 3C), which is described after steps 333-341.

At step 333, a ratio is found to determine the maximum value of the scale factor for the sample with index $n_2$ such that the amplitude threshold, C, is not exceeded. Namely, $$f_2 = \frac{C}{X_2}. \quad (25)$$

At step 334, the first index, $n_{L,2}$, to meet or exceed C in the second portion of the frame is found. The index $n_{L,2}$ may be found by searching forward from the beginning of the second portion until $|X(n)| \geq C$. In some embodiments, $n_{L,2}$ may be found using code similar to the pseudo code above for finding $n_{L,1}$ in step 309 (e.g., for n=M+1 to N+M). Though, $n_{L,2}$ may be found any suitable way.

At step 335, a slope, $s_E$, is found. In some embodiments, $s_E$ may be defined as $$s_E = \frac{f_2 - f_o}{n_{L,2}}. \quad (26)$$

Though, $s_E$ may be defined in any suitable way.

At step 337, the scale factor, f(n), is found.

$$f(n) = f_o + s_E n, \text{for } 1 \leq n \leq N \quad (27)$$

At step 339, the scale factor, f(n), is applied to the samples in the first portion of the frame. The scale factor may be applied similarly as described for step 327. Note that f(N) may be defined as $f_o$ the next frame.

At step, 341, the scaled samples, O(n), are output in any suitable way.

Returning now to step 331, consider the case where the condition $X_2 > C$ is not met. When $X_2 \leq C$, method 300 proceeds to step 343. If step 343 is reached, then none of the samples in the entire working buffer, X(n), has a magnitude greater than the amplitude threshold, C. Accordingly, in some embodiments, the scaling factor tends towards unity. However, to avoid a discontinuity in the scale factor, the scale factor gradually increases when the initial scale factor is less than 1.

At step 343, a determination is made whether the initial scale factor, $f_o$, is less than one.

$$f_o < 1? \quad (28)$$

This decision step may be optionally performed as following the "Yes" branch when $f_o = 1$ may produce the same output as following the "No" branch. However, including this step may reduce computation when $f_o = 1$.

If the determination at step 343 is "No", method 300 continues to step 345, where the original samples of X(n) in the first portion, P1, are output as O(n) Effectively the trivial scaling factor of unity has been applied. The scaled output samples, O(n), may be output in any suitable way.

If, however, $f_o < 1$, and the determination at step 343 is "Yes", then method 300 continues to step 347, where a slope, $s_D$, is found. According to some embodiments, $$s_D = \frac{1 - f_o}{4N}. \quad (29)$$

Though, $s_D$ may be computed in any suitable way. The choice of 4N for the denominator reflects a choice of time constant determined experimentally for an audio signal. It should be appreciated, that the time constant, and accordingly, the denominator may be chosen as any suitable value. For example, 3N or 5N may be appropriate in some embodiments.

At step 349, the scale factor, f(n), is found.

$$f(n) = f_o + s_D n, \text{for } 1 \leq n \leq N \quad (30)$$

At step 351, the scale factor, f(n), is applied to the samples in the first portion of the frame. The scale factor may be applied similarly as described for step 327.

At step, 353, the scaled samples, O(n), are output in any suitable way.

Methods 200 and 300 may be implemented in any suitable way. For example, the methods may be implemented in any suitable combination of hardware and software. Software implementations may be performed using any suitable programming language. Examples of suitable programming languages include, but are not limited to, C, C++, FORTRAN and Java. Software instructions may be recorded to any suitable type of computer-storage medium. For example, the software instructions may recorded to memory 102 of device 100 and executed by processor 101.

Those of skill in the art will appreciate that certain additional checks may be made to avoid operations that may be illegal in certain programming environments. For example, denominators may be checked to ensure dividing by zero is avoided.

Those of skill in the art will appreciate that for simplicity, the dynamic range was taken to be centered at zero. However, the invention is not so limited. The dynamic range may be centered about a value other than zero. In some embodiments, an effective amplitude threshold, C, may be found by subtracting the average of the upper and lower amplitude thresholds from the upper amplitude threshold. Similarly the average of the upper and lower amplitude thresholds may be subtracted from the input signal. The "zero offset" signal may be processed for amplitude compression using, for example, method 200 or method 300. After processing, the offset may be added to the output signal.

Method 300 has been described for samples that are equally spaced along the parameter for which the input signal is sampled (e.g., an input signal sampled at fixed time intervals). The invention is not so limited. The sampling interval may vary as a function of the parameter (e.g., time, distance). Those of skill in the art will appreciate that provided information on the sampling interval is available, index n may be converted to the parameter with which the signal varies. The scale factor may then be calculated based additionally on the parameter value for each sample.

Several example situations of the execution of method 300 are described with reference to FIGS. 8-12. In each figure, a plot is shown of the envelope of a working buffer (dash-dot line), the calculated scale factor, and the envelope of the scaled output signal. For simplicity of depiction, only the envelope of the input and output signal are shown. In each example the first portion has 1024 samples (N=1024), and the second portion has 512 samples (M=512). The amplitude threshold, C, is 0.7 in each example.

Figure 8:
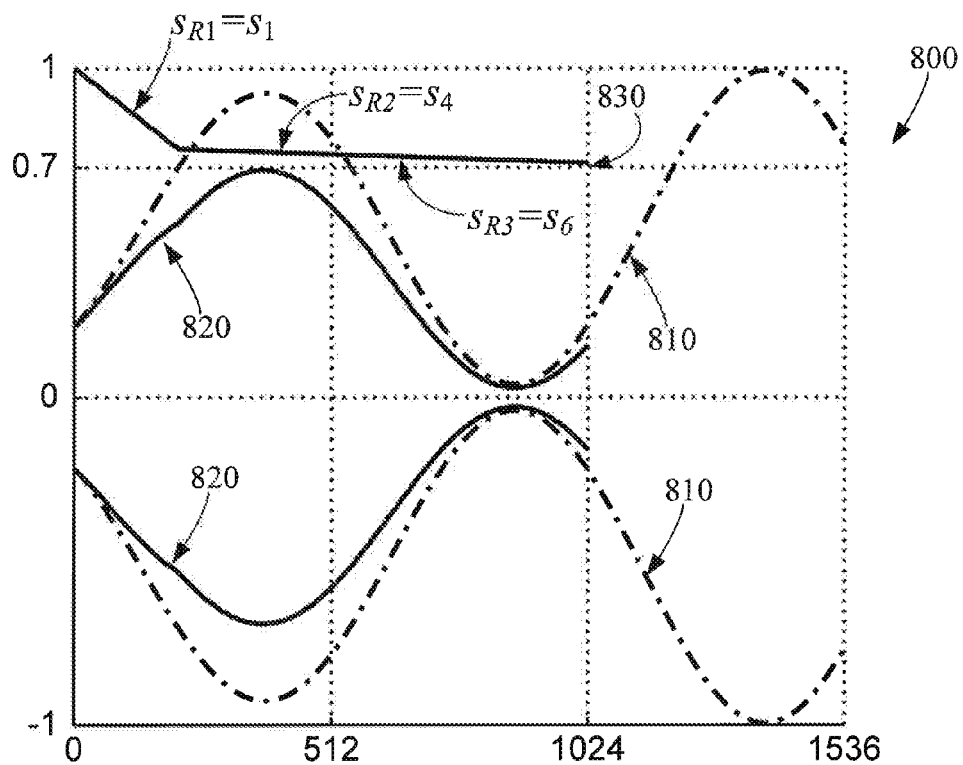
FIGS. 8-12 are examples plots an input envelope and an output envelope according to some embodiments.

FIG. 8 shows a plot 800. Samples in the working buffer, represented by envelope 810, exceed the threshold in both the first and second portions of the frame. Accordingly, method 300 proceeds along the branch beginning as step 307 (FIG. 3A). The slope of scale factor 830 decreases rapidly until $n_{L,1}$, to insure that the amplitude at $n_1$ is less than the amplitude threshold, 0.7. After $n_{L,1}$, scale factor 830 decreases gradually even further in preparation for scaling the large peak in the next frame. Output signal 820 is always less than the amplitude threshold, C, as desired.

Figure 9:
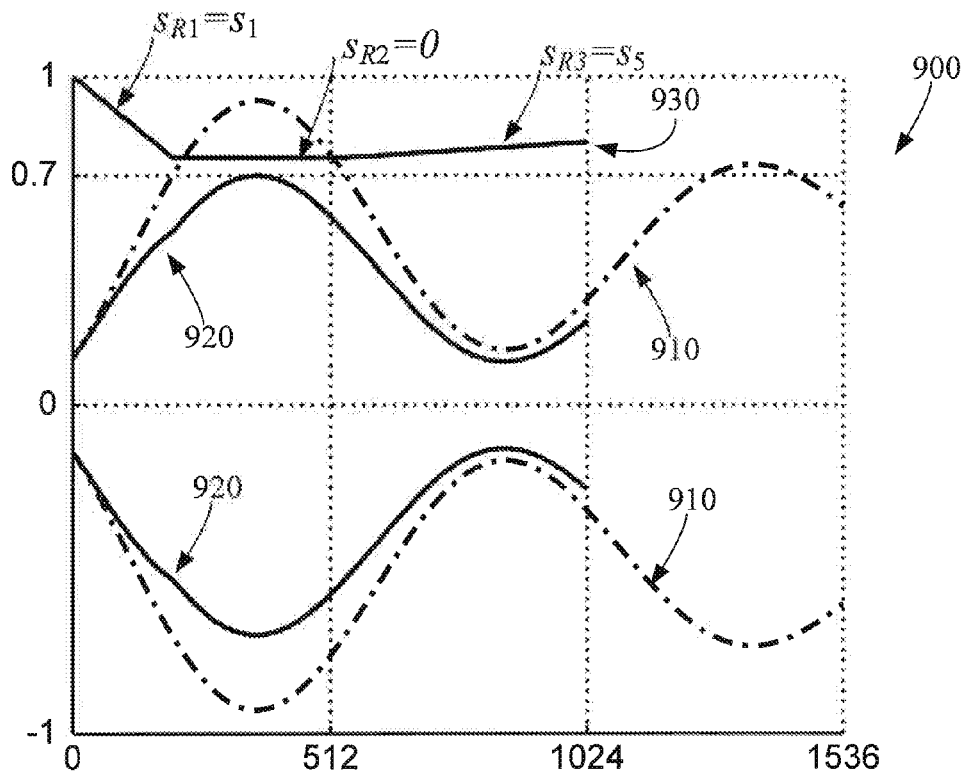

FIG. 9 shows a plot 900. Again, input signal 910 exceeds the amplitude threshold of 0.7 in both the first and second portions of the frame, however, here the peak in the first portion is much larger than the peak in the second portion. Scale factor 930 slopes down rapidly to $n_{L,1}$, where it is then constant until $n_{R,1}$. After $n_{R,1}$, scale factor 930 begins increasing in preparation for the peak in the second portion. Again, output signal 920 is always less than the amplitude threshold, C, as desired.

Figure 10:
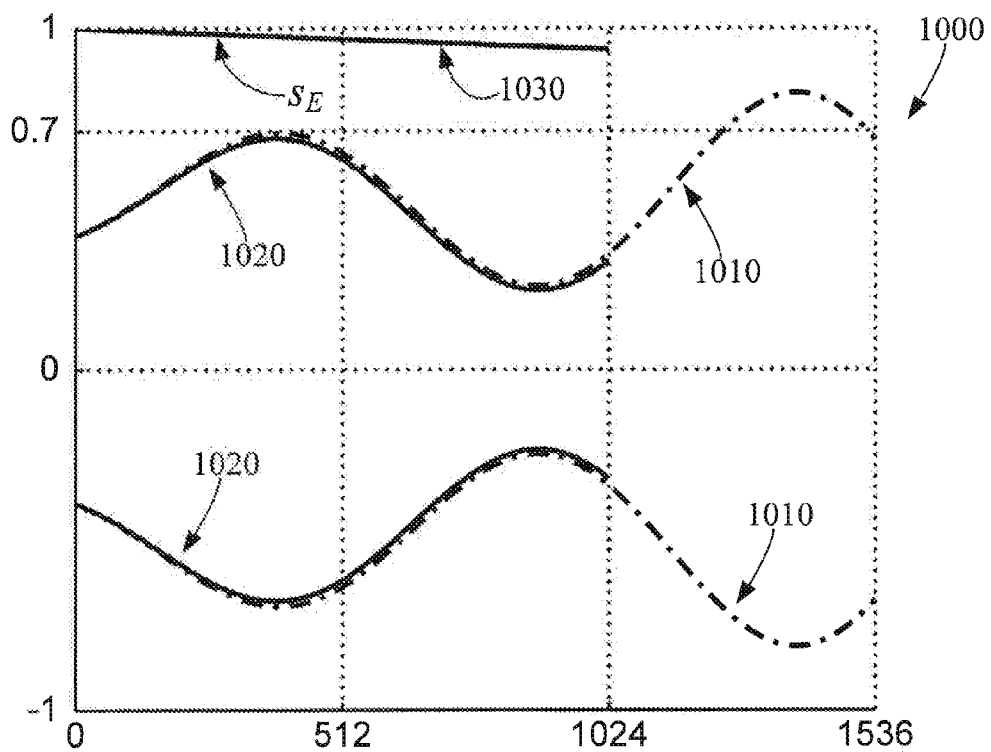

FIG. 10 shows a plot 1000. Input signal 1010 exceeds the amplitude threshold, C, only in the second portion of the frame. Accordingly, the branch of method 300 beginning at step 333 is followed. Scale factor 1030 has a constant slope over the entire first portion of the frame. Output signal 1020 is always less than the amplitude threshold of 0.7 as expected.

Figure 11:
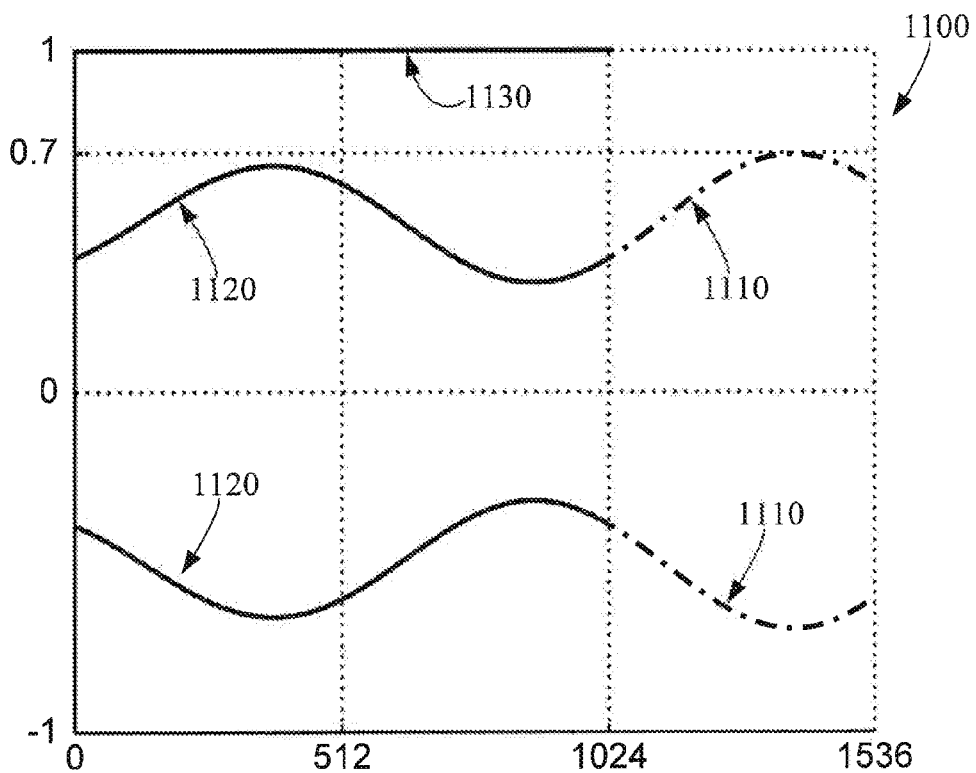

FIG. 11 shows a plot 1100. Input signal 1110 is always less than the amplitude threshold of 0.7. Because the initial scale factor, $f_o$, has is zero, input samples 1110 in the first portion of the frame are simply output as output signal 1120. This corresponds to the branch of method 300 beginning at step 345.

Figure 12:
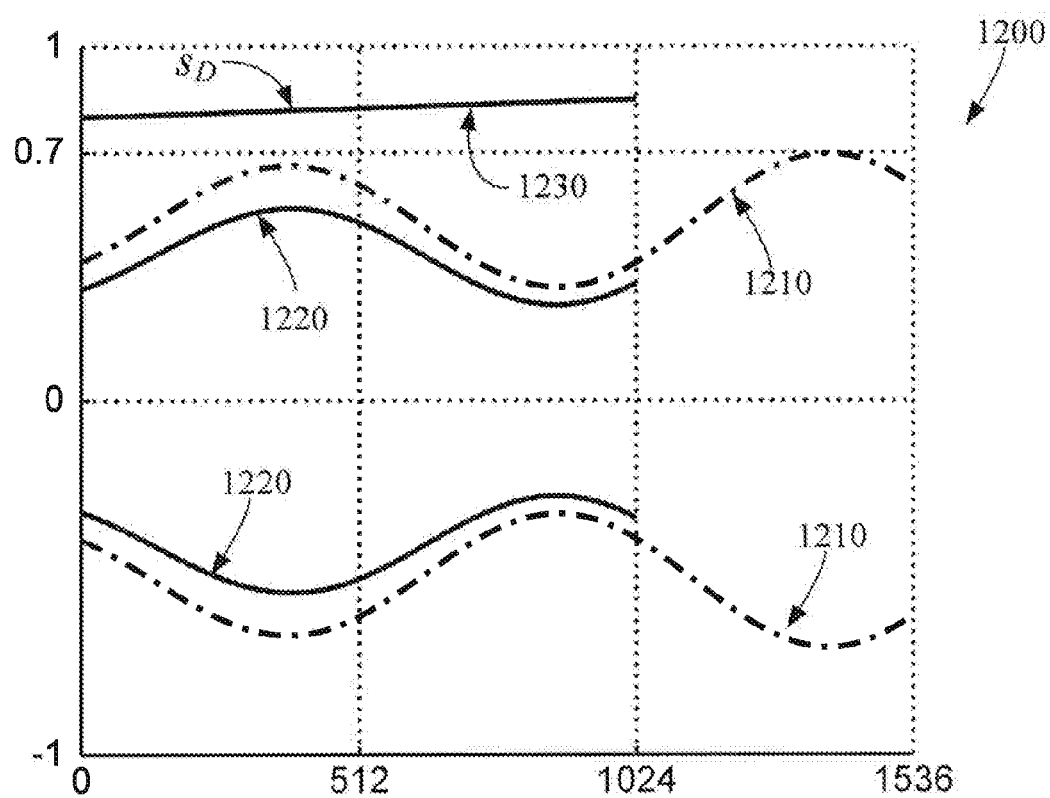

FIG. 12 shows a plot 1200. Again input signal 1210 is always less than the amplitude threshold, C. However, in this case the initial scale factor, $f_o$, is less than 1. Accordingly, the branch of method 300 beginning at step 347 is followed. Scale factor 1230 increases gradually over the course of the first portion of the frame. The resulting output signal 1220 is also shown.

Figure 13:
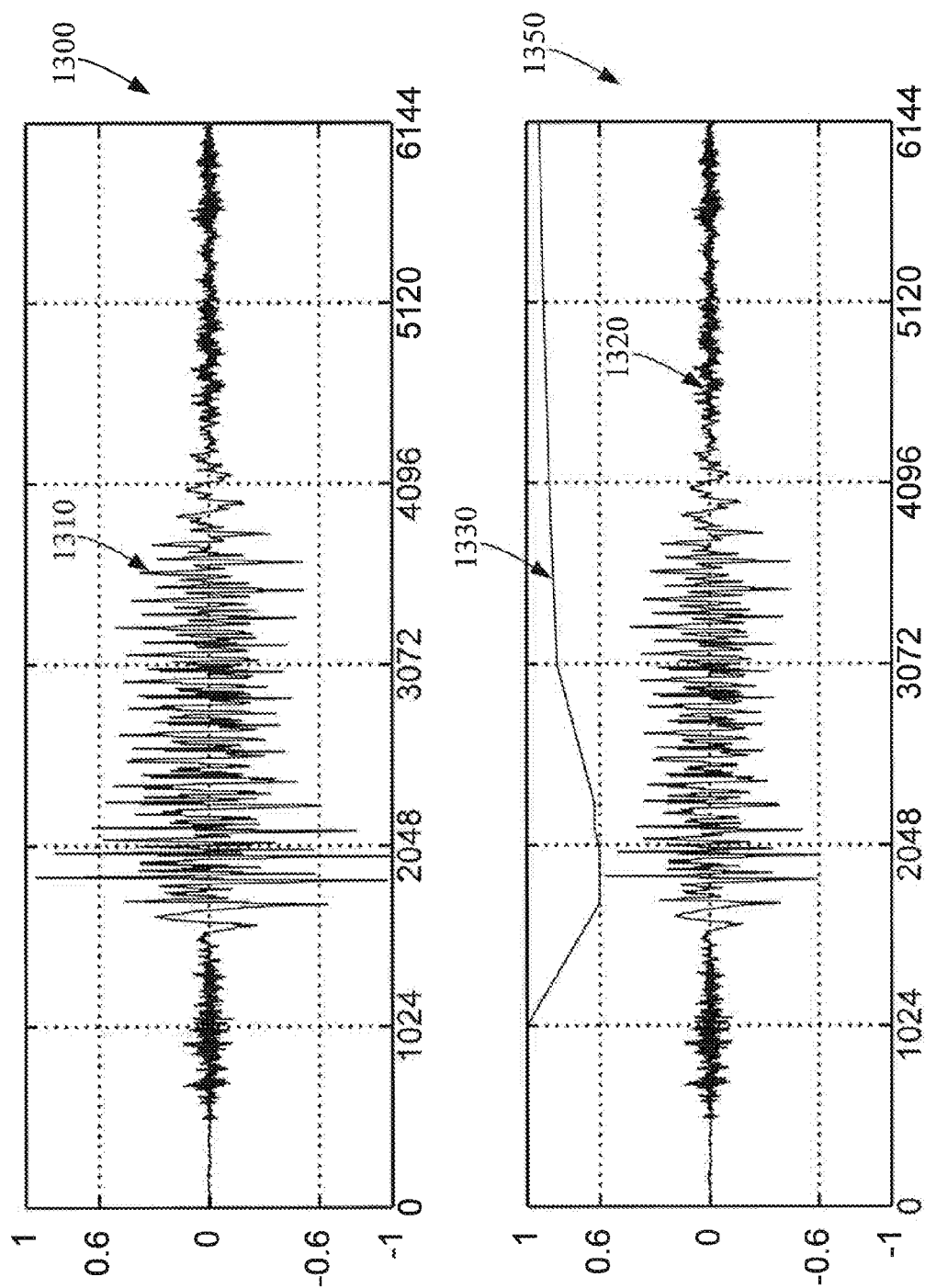
FIG. 13 is an example plot of an audio signal amplitude scaled according to some embodiments.

FIG. 13 shows a plot 1300 of an input audio signal 1310. The word "test" is spoken. Plot 1350, shown below plot 1300, shows an output signal 1320 and a scale factor 1330. To calculate output signal 1320, the following parameters were chosen: N=1024, M=512, and C=0.6. The grid lines shown for the axis of abscissa mark the beginnings of each frame. The grid lines shown for the axis of ordinate indicate the amplitude threshold. As expected, output signal 1320 is always within the bounds of the amplitude threshold of 0.6.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. A method of amplitude compressing a plurality of digital signals to mitigate clipping and outputting to a device for use by that device with reduced distortion, the method comprising:
    identifying a frame of each of the plurality of digital signals, each frame comprising a first set of samples followed by a second set of samples;
    determining a first peak value among all of the first sets of samples;
    determining a second peak value among all of the second sets of samples;
    computing an array of scale factors based at least in part on the first peak value and the second peak value, the size of the array being equivalent to the number of samples in the first set of samples;
    scaling each of the plurality of digital signals to reduce later distortion of a scaled plurality of signals by applying the array of scale factors to corresponding samples in each of the first sets of samples; and
    outputting the scaled plurality of signals to the device.

2. The method of claim 1, wherein each sample among the scaled plurality of digital signals has a magnitude no greater than a threshold.

3. The method of claim 1, wherein the plurality of digital signals comprises a stereo-left channel and a stereo-right channel.

4. The method of claim 1, wherein the first peak value is a maximum absolute value among all of the first sets of samples and wherein the second peak value is a maximum absolute value among the all of the second sets of samples.

5. The method of claim 1, wherein computing the array of scale factors comprises a first method of computation if both the first and second peak values are less than a threshold, a second method of computation if the first peak value is less than the threshold and the second peak value is greater than the threshold, and a third method of computation if the first peak value is greater than the threshold.

6. The method of claim 5, wherein the first method of computation comprises setting values in the array of scale factors to unity if an initial scale factor is unity and comprises setting values in the array of scale factors as gradually increasing from the initial scale factor if the initial scale factor is less than unity.

7. The method of claim 5, wherein the second method of computation comprises setting values in the array of scale factors as gradually increasing from an initial scale factor.

8. The method of claim 5, wherein the third method of computation comprises dividing the first sets of samples into a plurality of regions, finding a slope of the samples in each region, and determining the array of scale factors based at least in part on an initial scale factor and at least one of the slopes.

9. The method of claim 8, wherein the slopes are determined based at least in part on the first and second peak values.

10. The method of claim 8, wherein the first set of samples is indexed according to a reproduction order, and further comprising:
    determining a lowest index of a sample in the first set of samples to exceed the amplitude threshold;
    determining a highest index of a sample in the first set of samples to exceed the amplitude threshold,
    wherein a first region in the plurality of regions comprises samples in the first set of samples with an index less than the lowest index, a second region in the plurality of regions comprises samples in the first set of samples with an index greater than the lowest index and less than the highest index, and a third region in the plurality of regions comprises samples in the first set of samples with an index greater than the highest index.

11. A signal-processing device for amplitude compressing a plurality of digital signals to mitigate clipping and outputting to a device for use by that device with reduced distortion, the signal-processing device comprising:
    a frame-identifying module for identifying a frame in each of the plurality of signals, each frame comprising a first set of samples followed by a second set of samples;
    a buffer for storing the first sets of samples for each of the frames; and
    a scaling module for scaling each of the plurality of digital signals to reduce later distortion of a scaled plurality of signals by applying an array of scale factors to corresponding samples in each of the first sets of samples, the array of scale factors being computed based at least in part on a first peak value among all of the first sets of samples and a second peak value among all of the second sets of samples, the size of the array being equivalent to the number of samples in the first set of samples; and
    an output of the signal-processing device that outputs the scaled plurality of signals to the device.

12. The signal-processing device of claim 11, further comprising an analog-to-digital converter for converting an analog input source into at least one of the plurality of digital signals.

13. The signal-processing device of claim 11, further comprising a digital-to-analog converter for converting at least one of the plurality of scaled digital signals into an analog signal for playback on a reproduction device.

14. The signal-processing device of claim 11, further comprising a storage medium for storing at least a portion of the plurality of scaled digital signals.

15. The signal-processing device of claim 11, wherein computing the array of scale factors comprises a first method of computation if both the first and second peak values are less than a threshold, a second method of computation if the first peak value is less than the threshold and the second peak value is greater than the threshold, and a third method of computation if the first peak value is greater than the threshold.

16. The signal-processing device of claim 15, wherein the first method of computation comprises setting values in the array of scale factors to unity if an initial scale factor is unity and comprises setting values in the array of scale factors as gradually increasing from the initial scale factor if the initial scale factor is less than unity.

17. The signal-processing device of claim 15, wherein the second method of computation comprises setting values in the array of scale factors as gradually increasing from an initial scale factor.

18. The signal-processing device of claim 15, wherein the third method of computation comprises dividing the first sets of samples into a plurality of regions, finding a slope of the samples in each region, and determining the array of scale factors based at least in part on an initial scale factor and at least one of the slopes.

19. A signal-processing device for amplitude compressing a plurality of digital signals to mitigate clipping and outputting to a device for use by that device with reduced distortion, the device comprising:
   means for identifying a frame of each of the plurality of digital signals, each frame comprising a first set of samples followed by a second set of samples;
   means for determining a first peak value among all of the first sets of samples;
   means for determining a second peak value among all of the second sets of samples;
   means for computing an array of scale factors based at least in part on the first peak value and the second peak value, the size of the array being equivalent to the number of samples in the first set of samples; and
   an output of the signal-processing device that outputs the scaled plurality of signals to the device.

20. The signal-processing device of claim 19, further comprising a digital-to-analog converter for converting at least one of the plurality of scaled digital signals into an analog signal for playback on a reproduction device.

* * * * *